(12) United States Patent
Xue et al.

(10) Patent No.: US 10,923,020 B2
(45) Date of Patent: Feb. 16, 2021

(54) SHIFT REGISTER UNIT AND DRIVING METHOD THEREOF, GATE DRIVING CIRCUIT AND DISPLAY PANEL

(71) Applicants: BOE TECHNOLOGY GROUP CO., LTD., Beijing (CN); Hefei BOE Optoelectronics Technology Co., Ltd., Anhui (CN)

(72) Inventors: Wei Xue, Beijing (CN); Hongmin Li, Beijing (CN); Ying Wang, Beijing (CN); Fengjing Tang, Beijing (CN); Li Sun, Beijing (CN)

(73) Assignees: BOE TECHNOLOGY GROUP CO., LTD., Beijing (CN); Hefei BOE Optoelectronics Technology Co., Ltd., Hefei (CN)

( * ) Notice: Subject to any disclaimer, the term of this patent is extended or adjusted under 35 U.S.C. 154(b) by 197 days.

(21) Appl. No.: 16/134,764

(22) Filed: Sep. 18, 2018

(65) Prior Publication Data
US 2019/0096312 A1    Mar. 28, 2019

(30) Foreign Application Priority Data

Sep. 22, 2017 (CN) .......................... 2017 1 0865600

(51) Int. Cl.
*G11C 19/00*    (2006.01)
*G09G 3/20*    (2006.01)
(Continued)

(52) U.S. Cl.
CPC ......... *G09G 3/2092* (2013.01); *G09G 3/3266* (2013.01); *G09G 3/3677* (2013.01);
(Continued)

(58) Field of Classification Search
None
See application file for complete search history.

(56) References Cited

U.S. PATENT DOCUMENTS 9,922,997 B2 * 3/2018 Xiao ..................... H01L 27/124
2007/0079192 A1   4/2007 Kim et al.
(Continued)

FOREIGN PATENT DOCUMENTS

CN    104867472 A    8/2015
CN    105609136 A    5/2016
(Continued)

OTHER PUBLICATIONS

Chinese Office Action dated Sep. 4, 2019, from application No. 201710865600.8.

*Primary Examiner* — Tuan T Lam
(74) *Attorney, Agent, or Firm* — Thomas|Horstemeyer, LLP (57) ABSTRACT

The present disclosure provides a shift register unit. The shift register unit includes an input module, an output module and an output control module. The input module is connected to an input signal terminal, a first power supply signal terminal and a pull-up node, and is configured to transmit a first power supply signal to the pull-up node. The output module is connected to the pull-up node, a clock signal terminal and an output control node, and is configured to transmit a clock signal to the output control node. The output control module is connected to the output control node, the clock signal terminal and a signal output terminal, and is configured to transmit a signal of the output control node to the signal output terminal under the control of the clock signal.

14 Claims, 4 Drawing Sheets

(51) Int. Cl.
    *G11C 19/28* (2006.01)
    *G09G 3/3266* (2016.01)
    *G09G 3/36* (2006.01)

(52) U.S. Cl.
    CPC ..... *G11C 19/28* (2013.01); *G09G 2310/0286* (2013.01); *G09G 2310/08* (2013.01)

(56) References Cited

U.S. PATENT DOCUMENTS

| | | | | |
|---|---|---|---|---|
| 2007/0247932 A1* | 10/2007 | Tobita | .................. | G09G 3/3677 365/189.12 |
| 2010/0245337 A1* | 9/2010 | Hu | .................. | G09G 3/3677 345/213 |
| 2014/0119492 A1* | 5/2014 | Liu | .................. | G11C 19/28 377/64 |
| 2014/0169518 A1* | 6/2014 | Kong | .................. | G09G 3/3674 377/64 |
| 2014/0191937 A1* | 7/2014 | Xu | .................. | G09G 3/3648 345/99 |
| 2017/0018243 A1* | 1/2017 | Huang | .................. | G09G 3/36 |
| 2017/0039968 A1* | 2/2017 | Chen | .................. | G09G 3/3648 |
| 2017/0364170 A1* | 12/2017 | Gu | .................. | G02F 1/1362 |
| 2018/0082652 A1* | 3/2018 | Lv | .................. | G09G 3/3677 |
| 2018/0188578 A1* | 7/2018 | Wang | .................. | G02F 1/13306 |
| 2018/0286490 A1* | 10/2018 | Sun | .................. | G11C 19/184 |
| 2018/0293952 A1* | 10/2018 | He | .................. | H03K 17/284 |
| 2018/0315389 A1* | 11/2018 | Hong | .................. | G09G 3/20 |
| 2019/0051365 A1* | 2/2019 | Li | .................. | G09G 3/3677 |
| 2019/0057755 A1* | 2/2019 | Xiong | .................. | G11C 19/287 |
| 2019/0115090 A1* | 4/2019 | Tao | .................. | G11C 19/287 |

FOREIGN PATENT DOCUMENTS

| | | |
|---|---|---|
| CN | 105895046 A | 8/2016 |
| CN | 106023949 A | 10/2016 |
| KR | 20130074570 A | 7/2013 |

* cited by examiner

| Transmit, by the input module 10, a first power supply signal VD/S to a pull-up node PU to perform charging and store energy under the control of an input signal INPUT | S1 |
|---|---|
| Transmit, by the output module 40, a clock signal CLK to an output control node PCN under the control of the pull-up node PU | S2 |
| Transmit, by the output control module 50, a signal at the output control node to the signal output terminal OUTPUT under the control of the clock signal CLK | S3 |

SHIFT REGISTER UNIT AND DRIVING METHOD THEREOF, GATE DRIVING CIRCUIT AND DISPLAY PANEL

CROSS REFERENCE

The present application claims the priority of Chinese Patent application No. 201710865600.8, filed on Sep. 22, 2017, and the entire contents thereof are incorporated herein by reference as part of the present application

TECHNICAL FIELD

The present disclosure relates to display technologies, and particularly to a shift register unit and a driving method thereof, a gate driving circuit and a display panel.

BACKGROUND

With the development of optical technology and semiconductor technology, flat panel displays represented by Liquid Crystal Displays (LCDs) and Organic Light Emitting Diodes (OLEDs) are featured with light weight, low energy consumption, fast response, good color purity, high contrast, and the like, and thus dominate the display market.

In recent years, trends of display devices are designed in high integration and low cost. Represented by Gate Driver on Array (GOA) technology, a gate driving circuit is integrated into a peripheral region of an array substrate by using the GOA technology, which can effectively reduce manufacturing cost while realizing a slim bezel design. However, due to the effects of factors such as gate line load and transistor characteristics, an output waveform of a GOA unit often has a falling edge, and the presence of the falling edge may cause false output of a signal, thus resulting abnormal display.

It should be noted that information disclosed in above Background is only for enhancing the understanding of Background of the present disclosure, and thus may include information that does not constitute prior art known to those of ordinary skill in the art.

SUMMARY

Arrangements of the present disclosure provide a shift register unit and a driving method thereof, a gate driving circuit and a display device.

Other features and advantages of the present disclosure will be apparent from the following detailed description, or will be partly learned from the practice of the present disclosure.

According to an aspect of the present disclosure, there is provided a shift register unit that includes an input module, an output module and an output control module.

The input module is connected to an input signal terminal, a first power supply signal terminal and a pull-up node, and is configured to transmit a first power supply signal to the pull-up node under the control of an input signal.

The output module is connected to the pull-up node, a clock signal terminal and an output control node, and is configured to transmit a clock signal to the output control node under the control of the pull-up node.

The output control module is connected to the output control node, the clock signal terminal and a signal output terminal, and is configured to transmit a signal at the output control node to the signal output terminal under the control of the clock signal.

In an exemplary arrangement of the present disclosure, the output control module includes a first switching element.

A control terminal of the first switching element is connected to the clock signal terminal, a first terminal of the first switching element is connected to the output control node, and a second terminal of the first switching element is connected to the signal output terminal.

In an exemplary arrangement of the present disclosure, the input module includes a second switching element.

A control terminal of the second switching element is connected to the input signal terminal, a first terminal of the second switching element is connected to the first power supply signal terminal, and a second terminal of the second switching element is connected to the pull-up node.

In an exemplary arrangement of the present disclosure, the output module includes a third switching element and an energy storage element.

A control terminal of the third switching element is connected to the pull-up node, a first terminal of the third switching element is connected to the clock signal terminal, and a second terminal of the third switching element is connected to the output control node. The energy storage element is connected between the pull-up node and the output control node.

In an exemplary arrangement of the present disclosure, the shift register unit further includes a pull-down module.

The pull-down module is connected to the pull-up node, a second power supply signal terminal, a third power supply signal terminal, the output control node and the signal output terminal, and is configured to transmit a third power supply signal to the pull-up node, the output control node and the signal output terminal under the control of the pull-up node and a second power supply signal.

In an exemplary arrangement of the present disclosure, the pull-down module includes a fourth switching element, a fifth switching element, a sixth switching element, a seventh switching element and an eighth switching element.

A control terminal of the fourth switching element is connected to the second power supply signal terminal, a first terminal of the fourth switching element is connected to the second power supply signal terminal, and a second terminal of the fourth switching element is connected to a pull-down node.

A control terminal of the fifth switching element is connected to the pull-up node, a first terminal of the fifth switching element is connected to the third power supply signal terminal, and a second terminal of the fifth switching element is connected to the pull-down node.

A control terminal of the sixth switching element is connected to the pull-down node, a first terminal of the sixth switching element is connected to the third power supply signal terminal, and a second terminal of the sixth switching element is connected to the pull-up node.

A control terminal of the seventh switching element is connected to the pull-down node, a first terminal of the seventh switching element is connected to the third power supply signal terminal, and a second terminal of the seventh switching element is connected to the output control node.

A control terminal of the eighth switching element is connected to the pull-down node, a first terminal of the eighth switching element is connected to the third power supply signal terminal, and a second terminal of the eighth switching element is connected to the signal output terminal.

In an exemplary arrangement of the present disclosure, the shift register unit further includes a reset module.

The reset module is connected to a reset signal terminal, a fourth power supply signal terminal and the pull-up node, and is configured to transmit a fourth power supply signal to the pull-up node under the control of a reset signal.

In an exemplary arrangement of the present disclosure, the reset module includes a ninth switching element. A control terminal of the ninth switching element is connected to the reset signal terminal, a first terminal of the ninth switching element is connected to the fourth power supply signal terminal, and a second terminal of the ninth switching element is connected to the pull-up node.

In an exemplary arrangement of the present disclosure, all switching elements are transistors.

According to an aspect of the present disclosure, there is provided a gate driving circuit, including M stages which are connected in cascade, where M is an positive integer greater than or equal to 2.

A signal output terminal of a (M−1)-th stage is connected to an input signal terminal of a M-th stage, and a signal output terminal of the M-th stage is connected to a rest signal terminal of the (M−1)-th stage.

Each of the stages is a shift register unit as described above.

According to an aspect of the present disclosure, there is provided a display panel, including the above-described gate driving circuit.

According to an aspect of the present disclosure, there is provided a method for driving the above-described shift register unit, that includes transmitting, by the input module, a first power supply signal to a pull-up node to charge and store energy under the control of an input signal. The method includes transmitting, by the output module, a clock signal to an output control node under the control of the pull-up node. The method includes transmitting, by the output control module, a signal of the output control node to a signal output terminal under the control of the clock signal.

It is to be understood that both the foregoing general description and the following detailed description are exemplary and explanatory only and are not restrictive of the disclosure, as claimed.

BRIEF DESCRIPTION OF THE DRAWINGS

The accompanying drawings, which are incorporated in and constitute a part of this specification, illustrate arrangements consistent with the disclosure and, together with the description, serve to explain the principles of the disclosure. Apparently, the arrangements described are only a part and not all of the arrangements of the present disclosure. All other arrangements derived by those skilled in the art from the arrangements of the present disclosure without making any inventive effort fall within the scope of the present disclosure.

DETAILED DESCRIPTION

Exemplary arrangements will now be described more fully with reference to the accompanying drawings. However, the exemplary arrangements can be embodied in a variety of forms and should not be construed as being limited to the examples set forth herein; rather, these arrangements are provided so that this disclosure will be more complete and complete, It will be given to those skilled in the art. The described features, structures, or characteristics may be combined in any suitable manner in one or more arrangements. In the following description, numerous specific details are set forth However, one skilled in the art will appreciate that one or more of the specific details may be omitted or other methods, components, devices, steps, etc. may be employed. In other instances, well-known technical solutions are not shown or described in detail to avoid obscuring aspects of the disclosure.

In addition, the drawings are merely schematic representations of the present disclosure and are not necessarily to scale. The thicknesses and shapes of the various layers in the drawings do not reflect the true proportions and are merely for the purpose of illustrating the disclosure. The same reference numerals in the drawings denote the same or similar parts, and the repeated description thereof will be omitted.

Figure 1:
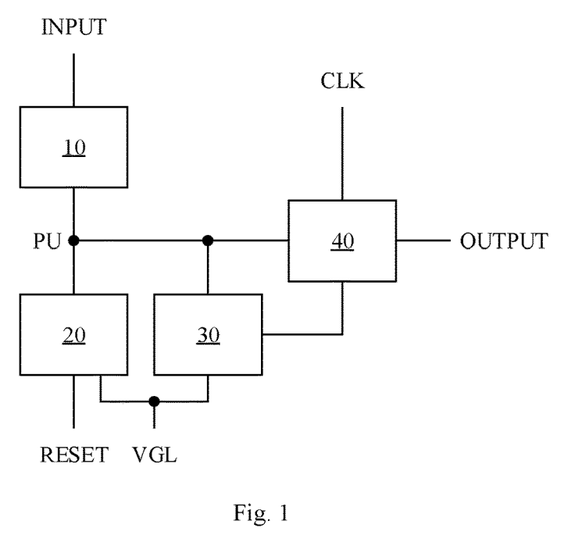
FIG. 1 schematically shows a block diagram of a GOA unit in a comparative example.
Figure 2:
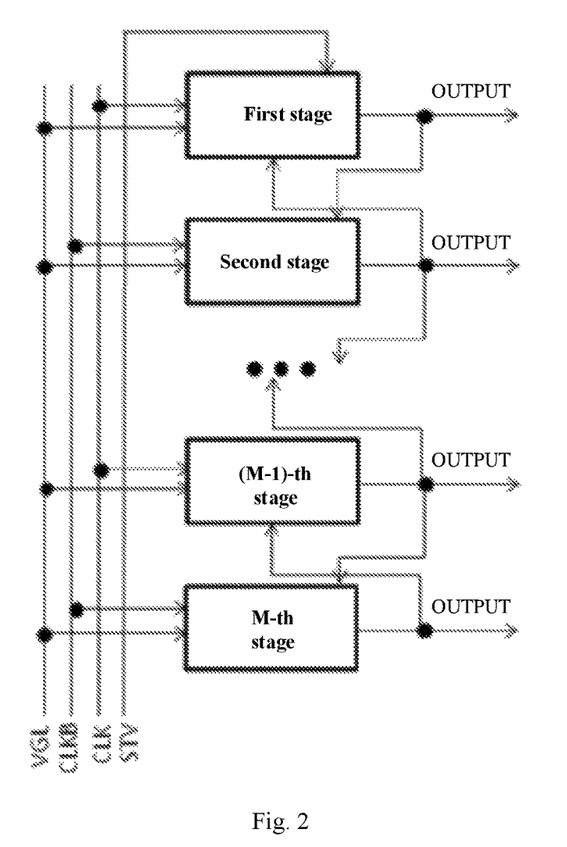
FIG. 2 schematically shows a cascaded structure diagram of a GOA circuit in a comparative example.

FIG. 1 and FIG. 2 show a block diagram of a GOA unit and a gate driving circuit, respectively.

Referring to FIG. 2, the gate driving circuit includes a plurality of stages, for example, first stage to M stage. The M stages are connected in cascade. Each of the stage may be a GOA unit, i.e., a shift register unit, as shown in FIG. 1. The M stages are responsible for outputting scanning signals for driving gate lines in a display panel. The value of M depends on the number of gate lines. M may be a positive integer greater than or equal to 2.

FIG. 1 shows one of the M stages. The M stages have the basically same structure. It is assumed that the GOA unit in FIG. 1 is a i-th stage in FIG. 2, where 1<i<M. As shown in FIG. 1, the GOA unit includes an input module 10, a reset module 20, a pull-down module 30 and an output module 40. The input module 10 in the i-th stage may be connected to the output module 40 in the (i−1)-th stage, and the reset module 20 in the i-th stage may be connected to the output module 40 of the (i+1)-th stage. The input module 10 in the i-th stage is responsible for storing energy for the output module 40. The output module 40 is responsible for outputting the stored energy while a clock signal CLK is coming. The reset module 20 is responsible for completely releasing energy of the output module 40; and the pull-down module 30 is responsible for releasing energy of the output module 40, so as to ensure stability of the GOA circuit. However, if a gate line is already overloaded (for example, if the GOA unit is applied to a high-resolution display panel) or due to the effects of factors such as transistor characteristics (for example, the transistor is small in size) in the output module, an output waveform of the GOA unit is often not a perfect square wave, but has a falling edge. When the falling edge is small, the switching of transistor(s) will not be affected; however, when the falling edge is large, at the beginning of an output phase of a next line after the end of an output phase of the current line, an output terminal of the current line cannot be completely turned off, and an output signal is still generated, thus resulting in two lines of output signals at the same time and causing abnormal display.

Figure 3:
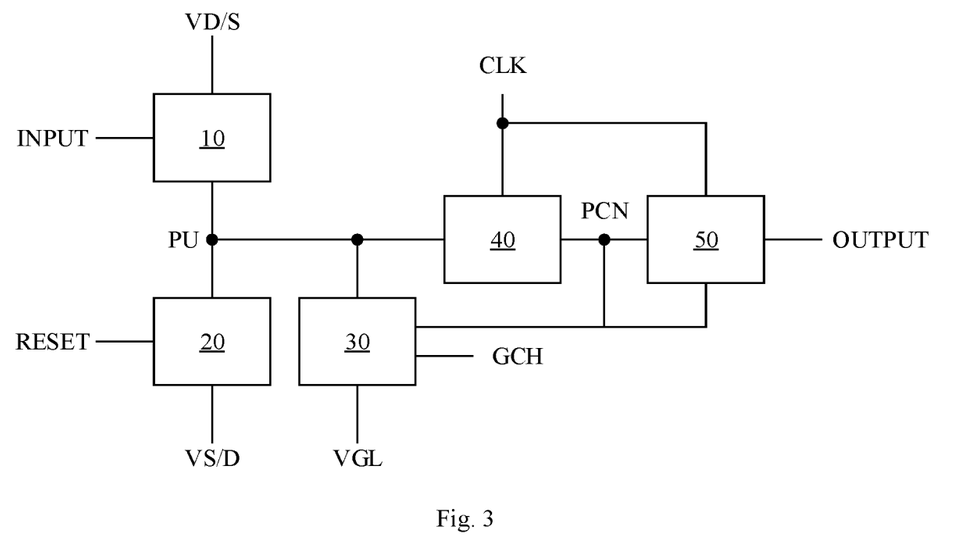
FIG. 3 schematically shows a block diagram of a shift register unit in an exemplary arrangement of the present disclosure.

An exemplary arrangement provides a shift register unit. As shown in FIG. 3, the shift register unit may include an input module 10, an output module 40 and an output control module 50.

The input module 10 is connected to an input signal terminal, a first power supply signal terminal and a pull-up node PU, and is configured to transmit a first power supply signal VD/S to the pull-up node PU under the control of an input signal INPUT.

The output module 40 is connected to the pull-up node PU, a clock signal terminal and an output control node PCN, and is configured to transmit a clock signal CLK to the output control node PCN under the control of the pull-up node PU.

The output control module 50 is connected to the output control node PCN, the clock signal terminal and a signal output terminal OUTPUT, and is configured to transmit a signal of the output control node PCN to the signal output terminal OUTPUT under the control of the clock signal CLK.

The shift register unit provided by the exemplary arrangement of the present disclosure, by adding an output control module after the output module, the signal is output under the control of the clock signal. In this way, the shift register unit can control effective level time of the output signal by the clock signal CLK, so that a falling edge of a waveform of the output signal can be greatly reduced, thus reducing the risk of false output and ensuring display quality.

Further, referring to FIG. 3, in the exemplary arrangement, the shift register may further include a reset module 20 and a pull-down module 30.

The reset module 20 is connected to a reset signal terminal, a fourth power supply signal terminal and the pull-up node PU, and is configured to transmit a fourth power supply signal VS/D to the pull-up node PU under the control of a reset signal RESET.

The pull-down module 30 is connected to the pull-up node PU, a second power supply signal terminal, a third power supply signal terminal, the output control node PCN and the signal output terminal OUTPUT, and is configured to transmit a third power supply signal VGL to the pull-up node PU, the output control node PCN and the signal output terminal OUTPUT respectively under the control of the pull-up node PU and a second power supply signal GCH.

Figure 4:
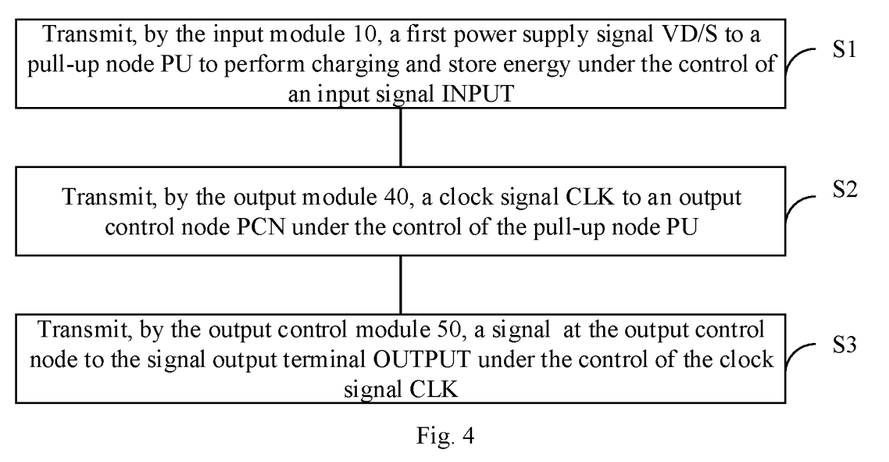
FIG. 4 schematically shows a method for driving a shift register unit in an exemplary arrangement of the present disclosure.

Based on the shift register unit provided by the exemplary arrangement, as shown in FIG. 4, a method for driving the shift register unit may include the following.

In S1, under the control of an input signal INPUT, the input module 10 transmits a first power supply signal VD/S to a pull-up node PU to charge and store energy.

In S2, under the control of the pull-up node PU, the output module 40 transmits a clock signal CLK to an output control node PCN.

In S3, under the control of the clock signal CLK, the output control module 50 transmits a signal of the output control node PCN to a signal output terminal OUTPUT.

It should be noted that, in the method for driving the shift register unit, S2 and S3 may be performed during the same phase, for example, a signal output phase.

The method for driving the shift register unit provided by the exemplary arrangement of the present disclosure, by controlling a time output from the clock signal CLK to a gate scan line through the output control module 50, the falling edge of the waveform of the output signal can be greatly reduced, thus reducing the risk of false output and ensuring display quality.

Figure 5:
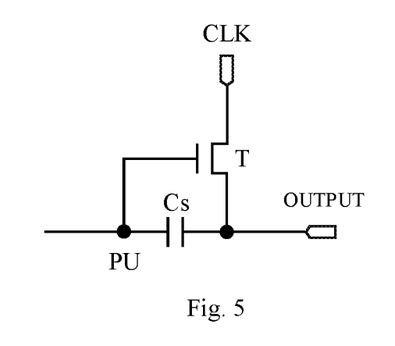
FIG. 5 schematically shows a circuit structure diagram of an output module of a shift register unit.
Figure 6:
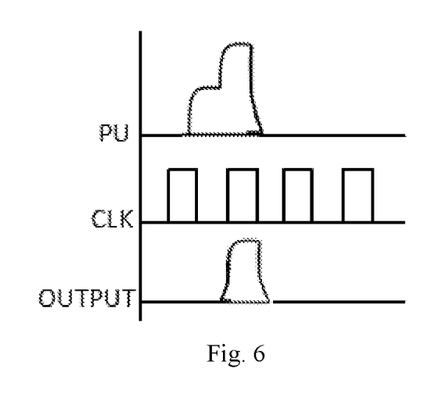
FIG. 6 schematically shows a relevant signal timing diagram of the output module shown in FIG. 5.

In one arrangement of the shift register unit, the structure of the output module 40, for example, may include a transistor T and a storage capacitor Cs shown in FIG. 5, and a signal timing of the output module 40 can be referred to a timing diagram shown in FIG. 6. The storage capacitor Cs may complete energy storage when the input module 10 stops working, so that a voltage at the pull-up node, PU, rises to turn on the transistor T. However, the clock signal CLK is at a low level at this time, and thus output is at a low level. When the clock signal CLK transitions to a high level subsequently, since the transistor T has been turned on, the signal output terminal OUTPUT receives the clock signal CLK and becomes a high level, and the potential at the pull-up node PU becomes even higher due to bootstrap effect of the storage capacitor Cs.

However, in the shift register unit having the above-mentioned output module circuit structure, a signal waveform output by the signal output terminal OUTPUT is often not a perfect square wave, but has a falling edge. When the falling edge is large, the output signal still exists in the current line while a next stage signal is being output, thus causing timing errors of the output signal at the current line, and further causing abnormal display.

In the exemplary arrangement, a circuit structure of the shift register unit is improved aiming at the above problem. The circuit structure of the shift register unit provided by the exemplary arrangement will be described in detail by referring to FIG. 7.

Figure 7:
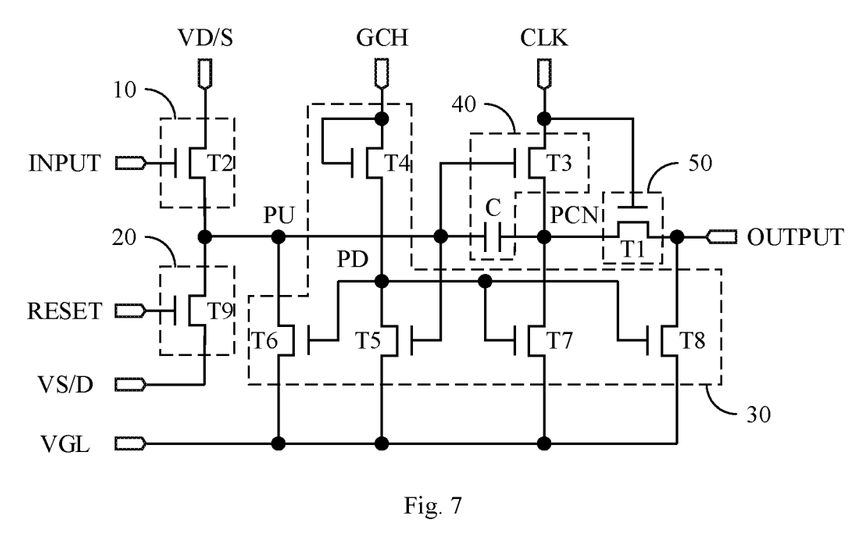
FIG. 7 schematically shows a circuit structure diagram of a shift register unit in an exemplary arrangement of the present disclosure.

The input module 10 may include a second switching element T2.

A control terminal of the second switching element T2 is connected to the input signal terminal, a first terminal of the second switching element T2 is connected to the first power supply signal terminal, and a second terminal of the second switching element T2 is connected to the pull-up node PU. The second switching element T2 is configured to be turned on in response to the input signal INPUT, so as to transmit the first power supply signal VD/S to the pull-up node PU.

The output module 40 may include a third switching element T3 and an energy storage element C.

A control terminal of the third switching element T3 is connected to the pull-up node PU, a first terminal of the third switching element T3 is connected to the clock signal, and a second terminal of the third switching element T3 is connected to the output control node PCN. The third switching element T3 is configured to be turned on in response to a signal of the pull-up node PU, so as to transmit the clock signal CLK to the output control node PCN.

The energy storage element C is connected between the pull-up node PU and the output control node PCN.

The output control module 50 may include a first switching element T1.

A control terminal of the first switching element T1 is connected to the clock signal terminal, a first terminal of the first switching element T1 is connected to the output control node PCN, and a second terminal of the first switching element T1 is connected to the signal output terminal OUTPUT. The first switching element T1 is configured to be turned on in response to the clock signal CLK, so as to transmit the signal of the output control node PCN to the signal output terminal OUTPUT.

The pull-down module 30 may include a fourth switching element T4, a fifth switching element T5, a sixth switching element T6, a seventh switching element T7 and an eighth switching element T8.

A control terminal of the fourth switching element T4 is connected to the second power supply signal terminal, a first terminal of the fourth switching element T4 is connected to the second power supply signal terminal, and a second terminal of the fourth switching element T4 is connected to a pull-down node PD; and the fourth switching element T4 is configured to be turned on in response to the second power supply signal GCH, so as to transmit the second power supply signal GCH to the pull-down node PD.

A control terminal of the fifth switching element T5 is connected to the pull-up node PU, a first terminal of the fifth switching element T5 is connected to the third power supply signal terminal, and a second terminal of the fifth switching element T5 is connected to the pull-down node PD. The fifth switching element T5 is configured to be turned on in response to the signal of the pull-up node PU, so as to transmit the third power supply signal VGL to the pull-down node PD.

A control terminal of the sixth switching element T6 is connected to the pull-down node PD, a first terminal of the sixth switching element T6 is connected to the third power supply signal terminal, and a second terminal of the sixth switching element T6 is connected to the pull-up node PU. The sixth switching element T6 is configured to be turned on in response to the signal of the pull-down node PD, so as to transmit the third power supply signal VGL to the pull-up node PU.

A control terminal of the seventh switching element T7 is connected to the pull-down node PD, a first terminal of the seventh switching element T7 is connected to the third power supply signal terminal, and a second terminal of the seventh switching element T7 is connected to the output control node PCN; and the seventh switching element T7 is configured to be turned on in response to the signal of the pull-down node PD, so as to transmit the third power supply signal VGL to the output control node PCN.

A control terminal of the eighth switching element T8 is connected to the pull-down node PD, a first terminal of the eighth switching element T8 is connected to the third power supply signal terminal, and a second terminal of the eighth switching element T8 is connected to the signal output terminal OUTPUT. The eighth switching element T8 is configured to be turned on in response to the signal of the pull-down node PD, so as to transmit the third power supply signal VGL to the signal output terminal OUTPUT.

The reset module 20 may include a ninth switching element T9.

A control terminal of the ninth switching element T9 is connected to the reset signal terminal, a first terminal of the ninth switching element T9 is connected to the fourth power supply signal terminal, and a second terminal of the ninth switching element T9 is connected to the pull-up node PU. The ninth switching element T9 is configured to be turned on in response to the reset signal RESET, so as to transmit the fourth power supply signal VS/D to the pull-up node PU.

It should be noted that, in the exemplary arrangement, the input module 10 and the reset module 20 are structurally symmetric, and thus the circuit structure of the shift register unit may be applied not only for forward scanning but also for reverse scanning. In the reverse scanning, the reset signal terminal is only used as the input signal terminal, and the input signal terminal is used as the reset signal terminal; meanwhile, the first power supply signal VD/S and the fourth power supply signal VS/D are interchanged. In this case, the second switching element T2 is a reset element, and the ninth switching element T9 is an input element.

In the exemplary arrangement, all switching elements may be transistors. In view of a unification of preparation processes, it is preferred that all transistors have the same type, for example, all transistors are N-type transistors or P-type transistors. A first terminal of one of the transistor may be a source electrode, and a second terminal of the transistor may be a drain electrode; or the first terminal of the transistor may be the drain electrode, and the second terminal of the transistor may be the source electrode. In addition, the transistors may be classified into enhancement transistors and depletion transistors based on different conductive modes, and the present arrangement does not impose limitations on this.

In the following description, for example, the switching elements are N-type transistors and the energy storage element C is the storage capacitor. The working principle of the shift register unit will be described by referring to the signal timing diagram shown in FIG. 8. The first power supply signal VD/S and the second power supply signal GCH are at a high level, and the third power supply signal VGL and the fourth power supply signal VS/D are at a low level.

Figure 8:
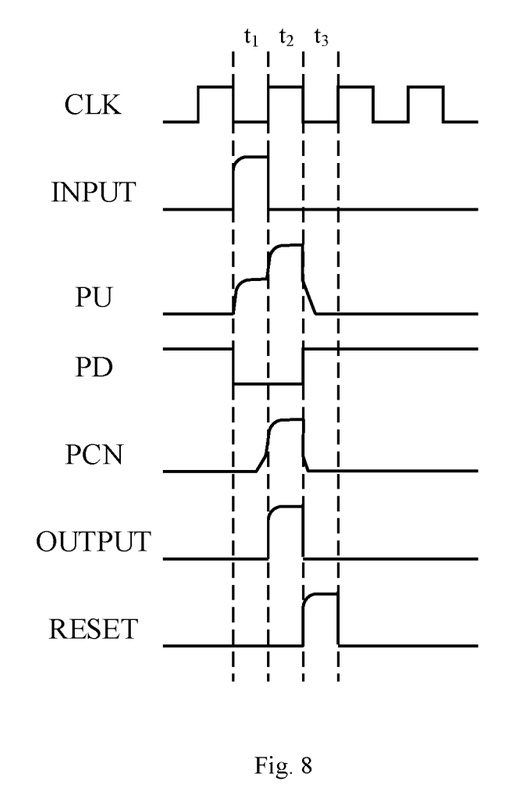
FIG. 8 schematically shows a signal timing diagram of a shift register unit in an exemplary arrangement of the present disclosure.

The working procedure of the shift register unit may include the following phases or periods.

During a period t1 (a charging phase), the input signal INPUT is at a high level, the second transistor is turned on to transmit the first power supply signal VD/S to the pull-up node PU and charge the storage capacitor C, and then the pull-up node PU is at a high level. Under the control of the pull-up node PU, although the third transistor is turned on, the clock signal CLK is at a low level at this time, and thus the output control node PCN is at a low level. Meanwhile, the five transistor controlled by the pull-up node PU is turned on to transmit the third power supply signal VGL to the pull-down node PD, and then the pull-down node PD is at a low level, and the sixth transistor to the eighth transistor are all turned off.

During a period t2 (an output phase), the input signal INPUT is at a low level, the clock signal CLK is at a high level, the pull-up node PU is kept at a high level under the control of the storage capacitor C, and then the third transistor is turned on to transmit the clock signal CLK to the signal output node PCN, and a level of the pull-up node PU is further increased by the bootstrap effect of the storage capacitor C. The third transistor is sufficiently turned on to completely transmit the clock signal CLK to the output control node PCN, and then the output control node PCN is at a high level. At this time, under the control of the clock signal CLK, the first transistor is turned on to transmit a signal of the output control node PCN to the signal output terminal OUTPUT, thus outputting a high level signal.

During a period t3 (a discharging phase), the reset signal Reset is at a high level, the ninth transistor is turned on to transmit the fourth power supply signal VS/D to the pull-up node PU, thus pulling down an electric potential of the pull-up node PU, and then the third transistor and the fifth transistor are all turned off, and an electric potential of the signal output node PCN is slowly reduced. At the same time, the second power supply signal GCH is at a high level, the fourth transistor is turned on to transmit the second power supply signal GCH to the pull-down node PD, and then the sixth transistor to the eighth transistor are all turned on to transmit the third power supply signal VGL to the pull-up node PU, the signal output node PCN and the signal output terminal OUTPUT respectively, thus ensuring that the output signal is of a low level.

Based on the above-described procedure, the signals of the shift register unit are output stage by stage can be realized, thus providing scanning signals for the gate driving circuit.

The shift register unit provided by the exemplary arrangement, by adding an output control module 50 after the output module 40, output time of the signal can be controlled, thus preventing false output of the signal. In the present arrangement, the output control module 50 is implemented by connecting the control terminal to the clock signal terminal, connecting the first terminal to the output control node PCN, and connecting the second terminal to the first switching element T1 of the signal output terminal OUTPUT. It should be noted that, although the exemplary arrangement is described by taking the clock signal CLK to control the output time of the signal as an example, schemes of using other signals to control the output time of the signal also belong to the concept of the present disclosure, and thus will also fall with the scope of the present disclosure.

Referring to FIG. 2, the exemplary arrangement also provides a gate driving circuit, including a plurality of cascaded shift register units described above.

An input signal terminal of a first stage shift register unit can be connected to an initial input signal STV, a signal output terminal OUTPUT of a (MM−1)-th shift register unit is connected to an input signal terminal of a M-th shift register unit, a signal output terminal OUTPUT of the M-th shift register unit is connected to a reset signal terminal of the (MM−1)th shift register unit, and a reset signal terminal of the M-th shift register unit can be separately connected to a frame reset signal.

It should be noted that specific details of the gate driving circuit have been described in corresponding shift register unit, which will not be repeated here.

The exemplary arrangement also provides a display panel, including a display region and a peripheral region. The peripheral region is provided with the above-described gate driving circuit, so as to form a GOA panel, which is beneficial to realize a slim bezel design.

The exemplary arrangement also provides a display device, including the above-described display panel.

For example, the display device may include any products or components with display functions, such as a mobile phone, a tablet computer, a television, a laptop computer, a digital frame, a navigator device, and the like, which is not specifically limited by the present disclosure.

Other arrangements of the disclosure will be apparent to those skilled in the art from consideration of the specification and practice of the disclosures herein. This application is intended to cover any variations, uses, or adaptations of the disclosure following the general principles thereof and including such departures from the present disclosure as come within known or customary practice in the art. It is intended that the specification and examples be considered as exemplary only, with a true scope and spirit of the disclosure being indicated by the following claims.

It will be appreciated that the inventive concept is not limited to the exact construction that has been described above and illustrated in the accompanying drawings, and that various modifications and changes can be made without departing from the scope thereof. It is intended that the scope of the disclosure only be limited by the appended claims.

What is claimed is:

1. A shift register unit, comprising an input module, an output module and an output control module;
    wherein:
    the input module is connected to an input signal terminal, a first power supply signal terminal and a pull-up node, and is configured to transmit a first power supply signal from the first power signal terminal to the pull-up node by controlling an input signal from the input signal terminal;
    the output module is connected to the pull-up node, a clock signal terminal and an output control node, and is configured to transmit a clock signal from the clock signal terminal to the output control node by controlling the pull-up node; and
    the output control module is connected to the output control node, the clock signal terminal and a signal output terminal, and is configured to transmit a signal at the output control node to the signal output terminal by controlling the clock signal;
    wherein the shift register unit further comprises a pull-down module;
    wherein the pull-down module is connected to the pull-up node, a second power supply signal terminal, a third power supply signal terminal, the output control node and the signal output terminal, and is configured to transmit a third power supply signal from the third power supply signal terminal to the pull-up node, the output control node and the signal output terminal by controlling the pull-up node and a second power supply signal from the second power supply signal terminal.

2. The shift register unit according to claim 1, wherein the output control module comprises a first switching element;
    wherein a control terminal of the first switching element is connected to the clock signal terminal, a first terminal of the first switching element is connected to the output control node, and a second terminal of the first switching element is connected to the signal output terminal.

3. The shift register unit according to claim 1, wherein the input module comprises a second switching element;
    wherein a control terminal of the second switching element is connected to the input signal terminal, a first terminal of the second switching element is connected to the first power supply signal terminal, and a second terminal of the second switching element is connected to the pull-up node.

4. The shift register unit according to claim 1, wherein the output module comprises a third switching element and an energy storage element;
    wherein a control terminal of the third switching element is connected to the pull-up node, a first terminal of the third switching element is connected to the clock signal terminal, and a second terminal of the third switching element is connected to the output control node; and
    the energy storage element is connected between the pull-up node and the output control node.

5. The shift register unit according to claim 1, wherein the pull-down module comprises a fourth switching element, a fifth switching element, a sixth switching element, a seventh switching element and an eighth switching element;
    wherein:
    a control terminal of the fourth switching element is connected to the second power supply signal terminal, a first terminal of the fourth switching element is connected to the second power supply signal terminal, and a second terminal of the fourth switching element is connected to a pull-down node;

a control terminal of the fifth switching element is connected to the pull-up node, a first terminal of the fifth switching element is connected to the third power supply signal terminal, and a second terminal of the fifth switching element is connected to the pull-down node;

a control terminal of the sixth switching element is connected to the pull-down node, a first terminal of the sixth switching element is connected to the third power supply signal terminal, and a second terminal of the sixth switching element is connected to the pull-up node;

a control terminal of the seventh switching element is connected to the pull-down node, a first terminal of the seventh switching element is connected to the third power supply signal terminal, and a second terminal of the seventh switching element is connected to the output control node; and a control terminal of the eighth switching element is connected to the pull-down node, a first terminal of the eighth switching element is connected to the third power supply signal terminal, and a second terminal of the eighth switching element is connected to the signal output terminal.

6. The shift register unit according to claim 1, wherein shift register unit further comprises a reset module;

wherein the reset module is connected to a reset signal terminal, a fourth power supply signal terminal and the pull-up node, and is configured to transmit a fourth power supply signal from the fourth power supply signal terminal to the pull-up node by controlling a reset signal from the reset signal terminal.

7. The shift register unit according to claim 6, wherein the reset module comprises a ninth switching element;

wherein a control terminal of the ninth switching element is connected to the reset signal terminal, a first terminal of the ninth switching element is connected to the fourth power supply signal terminal, and a second terminal of the ninth switching element is connected to the pull-up node.

8. The shift register unit according to claim 2, wherein the first switching element is a transistor.

9. The shift register unit according to claim 3, wherein the second switching element is a transistor.

10. The shift register unit according to claim 4, wherein the third switching element is a transistor, and the energy storage element is a capacitor.

11. The shift register unit according to claim 5, wherein the fourth switching element, the fifth switching element, the sixth switching element, the seventh switching element and the eighth switching element are all transistors.

12. A gate driving circuit, comprising M stages which are connected in cascade, where M is an positive integer greater than or equal to 2;

wherein a signal output terminal of a (M−1)-th stage is connected to an input signal terminal of a M-th stage, and a signal output terminal of the M-th stage is connected to a rest signal terminal of the (M−1)-th stage;

wherein each of the M stages comprises a shift register unit, which comprises an input module, an output module and an output control module;

wherein:

the input module is connected to an input signal terminal, a first power supply signal terminal and a pull-up node, and is configured to transmit a first power supply signal from the first power signal terminal to the pull-up node by controlling an input signal from the input signal terminal;

the output module is connected to the pull-up node, a clock signal terminal and an output control node, and is configured to transmit a clock signal from the clock signal terminal to the output control node by controlling the pull-up node; and the output control module is connected to the output control node, the clock signal terminal and a signal output terminal, and is configured to transmit a signal at the output control node to the signal output terminal by controlling the clock signal;

wherein the shift register unit further comprises a pull-down module;

wherein the pull-down module is connected to the pull-up node, a second power supply signal terminal, a third power supply signal terminal, the output control node and the signal output terminal, and is configured to transmit a third power supply signal from the third power supply signal terminal to the pull-up node, the output control node and the signal output terminal by controlling the pull-up node and a second power supply signal from the second power supply signal terminal.

13. A display panel, comprising the gate driving circuit according to claim 12.

14. A method for driving a shift register unit, wherein the shift register unit comprises an input module, an output module and an output control module;

wherein:

the input module is connected to an input signal terminal, a first power supply signal terminal and a pull-up node, and is configured to transmit a first power supply signal from the first power signal terminal to the pull-up node by controlling an input signal from the input signal terminal;

the output module is connected to the pull-up node, a clock signal terminal and an output control node, and is configured to transmit a clock signal from the clock signal terminal to the output control node by controlling the pull-up node; and the output control module is connected to the output control node, the clock signal terminal and a signal output terminal, and is configured to transmit a signal at the output control node to the signal output terminal by controlling the clock signal;

wherein the shift register unit further comprises a pull-down module;

wherein the pull-down module is connected to the pull-up node, a second power supply signal terminal, a third power supply signal terminal, the output control node and the signal output terminal, and is configured to transmit a third power supply signal from the third power supply signal terminal to the pull-up node, the output control node and the signal output terminal by controlling the pull-up node and a second power supply signal from the second power supply signal terminal;

wherein the method comprises:

transmitting, by the input module, the first power supply signal and the pull-up node to perform charging and store energy under the control of an input signal;

transmitting, by the output module, the clock signal to the output control node by controlling the pull-up node; and transmitting, by the output control module, a signal at the output control node to the signal output terminal by controlling the clock signal.

\* \* \* \* \*